(12) United States Patent  
Wang et al.

(10) Patent No.: US 6,594,812 B2  
(45) Date of Patent: Jul. 15, 2003

(54) METAL INTERCONNECTION READ ONLY MEMORY CELL

(75) Inventors: Chien-Fan Wang, Lu-Cho (TW); Hung-Chang Yu, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/918,008

(22) Filed: Jul. 30, 2001

(65) Prior Publication Data

US 2003/0023945 A1 Jan. 30, 2003

(51) Int. Cl.$^7$ ............................................... G06F 17/50
(52) U.S. Cl. ....................................................... 716/16
(58) Field of Search ............................. 257/530; 716/16

(56) References Cited

U.S. PATENT DOCUMENTS 6,097,077 A * 8/2000 Gordon et al. .............. 257/530

* cited by examiner

*Primary Examiner*—David Nelms  
*Assistant Examiner*—Thao P Le  
(74) *Attorney, Agent, or Firm*—Tung & Associates

(57) ABSTRACT

A method and system for forming a programmable logic array from a plurality of read only memory cells. The interconnection of the first metal layer with a second metal layer results in the formation of a read only memory cell therebetween, such that a plurality of read only memory cells can be configured to form a programmable logic array. One or more of the read only memory cells may be programmed utilizing a particular contact via programming technique, resulting in a shortened turn-around-time, reduced read only memory cell size, and a reduction in the necessity of requiring additional masks for read only memory logical processes associated with the programmable logic array. The memory cells comprise mask ROM cells which do not require extra masks, and can be programmed utilizing via programming techniques. The utilization of a first and second metal layer in interconnection configuration for a ROM cell results in smaller cell size.

20 Claims, 7 Drawing Sheets

METAL INTERCONNECTION READ ONLY MEMORY CELL

TECHNICAL FIELD

The present invention relates to read only memory (ROM) cells. The present invention also relates to methods and systems for forming ROM cell-based devices. The present invention additionally relates to methods and systems for configuring ROM cell architectures. This invention additionally pertains to a type of mask ROM. More specifically, the present invention is related to a contact or via type of mask ROM, which permits shortening of the cycle time of the manufacturing process.

BACKGROUND OF THE INVENTION

Read only memory (ROM) is so named because its cells can read data only from the memory cells. ROM is essentially a semiconductor circuit into which code or data can be permanently installed by a particular manufacturing process. ROM circuits are typically utilized to permanently store code in electronic equipment, such as computers, microprocessor systems, and so forth. The code or information stored in the ROM circuit is non-volatile when the power supply is powered off. There are various types of ROM devices, including Mask ROM, PROM (Programmable ROM), EPROM (Erasable Programmable ROM) and EEPROM (Electrically Erasable Programmable ROM). Such devices differ from one another in the type of methods utilized by the particular ROM to store data. Mask ROM is the most fundamental type of ROM.

For mask ROM, the memory data are loaded in the memory cells during manufacture. The data-writing step is called programming or coding. Usually, the interval from the time when the coding data in the mask ROM are obtained from the user to the time of shipment of the product is referred to as the cycle time, or turn-around-time. For ROM products, shortening the turn-around-time is an important task from the viewpoint of the commercial value of the products and productivity.

Depending on the data coding method, the mask ROMs can be classified into the diffusion type, contact type and via contact type. For each of these methods, there is a trade-off relationship between the cycle time and the degree of integration. When the actual ROM products are manufactured, it is necessary to select the appropriate method corresponding to the characteristics and demands on the specific type of products.

Memory cells are typically fabricated on a portion of a ROM device that includes an array of single transitory, typically a field effect transistor (FET), arranged in rows and columns. The arrays of FETs are built by first forming an array of closely spaced parallel electrically conducting line regions in the semiconductor substrate called "bit lines". The bit lines serve as the source/drain regions of the FETs, and also serve as the electrical interconnections to the peripheral circuits for outputting the stored binary data. The buried bit lines are usually formed in the semiconductor substrate by ion implantation and a thermal oxide is then grown on the semiconductor substrate forming the gate oxide of the FET between the bit lines. The thermal oxide also provides the electrical insulation layer over the bit lines.

A plurality of closely spaced parallel conducting lines referred to as "word lines", usually formed from a doped polysilicon layer, can then be formed on the semiconductor substrate having an orthogonal direction to the buried bit lines. The word lines serve as the gate electrode of the FETs and also function as the electrical interconnection to the peripheral address decode circuit. The array of ROM cells are then coded with information, such as micro-instruction, by permanently rendering selected transistors non-conducting during processing, while non-coded cells can be switch on when accessed by way of the address decode circuits. The coded information represented by a change or no change in the voltage level at the output circuit is used to represent the binary 1's and 0's. The code for the ROM is introduced during device processing by using a ROM code mask during one of the processing steps.

There are only two states in a conventional mask ROM device, the "ON" state and the "OFF" state. The "OFF" state is typically defined by code implantation to increase the cell threshold voltage ($V_{th}$) is above 5 Volt, while the "ON" state is defined the cell Vth to be below 1 Volt. In a high-density mask ROM (32 M or 64 M), a conventional two state mask ROM will consume a large wafer area due to the large chip size. If one memory cell can store more than three kinds of data, called a multiple states mask ROM, it is possible to greatly increase the storage capacity of a mask ROM. For example, if one memory cell can store four kinds of data, it is possible to double the storage capacity in one chip without increasing the chip area. The mask ROM is coded with its data, i.e., has its data stored in it, by using a specialized mask (representing particular required for a user) during the fabrication process.

Data stored in a mask ROM cannot be changed, rather it is only possible to read the data. A type of mask ROM causes a predetermined transistor to have a status that differs from other transistors by implanting impurity ions, so that a datum is coded—that is, the mask ROM causes a predetermined transistor to have an OFF state by implanting impurity ions during fabrication. Transistors for which impurity ions are not implanted during fabrication have an ON state, and vice versa; therefore, the data are coded.

A number of ROM programming techniques are known in the art. Diffusion layer programming, ion implantation, and contact programming are types of ROM manufacturing processes. Among these processes, contact programming is a technique in which a programming process is provided near the final operational steps of semiconductor device manufacturing. The contact programming system is generally a method, which can realize a short turn-around-time.

FIG. 1 illustrates a prior art Mask ROM cell configuration 20. In the example depicted in FIG. 1, a single ROM cell 22 is illustrated, which is formed from a polysilicon metal layer 26. A polysilicon metal layer 26 and single ROM cell 22 are situated below a diffusion region 32. A polysilicon metal layer 30 is situated below a diffusion region 34 and an active region 36. The example illustrated in FIG. 1 includes a total of four polysilicon metal layers 24, 26, 28, and 30. Those skilled in the art will recognize the configuration depicted in FIG. 1 as an implementation of Contact/Via programming, a well-known method for programming a ROM cell, such as the single ROM cell 22. An advantage of the Contact/Via programming technique is that it results in a short turn-around-time. A major disadvantage of this ROM programming method, however, is that it requires a large cell size.

FIG. 2 depicts a prior art diffusion-programming configuration 40. In the example depicted in FIG. 2, a series of polysilicon layers 44, 46 and 48 are situated adjacent a diffusion region 46 and 58. Two single ROM cells 52 and 54 are respectively situated above polysilicon layers 48 and 46. Those skilled in the art will recognize the configuration illustrated in FIG. 2 as depicting an implementation of diffusion programming for ROM cells. An advantage or diffusion programming is that smaller cell sizes can be utilized. However, a major disadvantage of diffusion programming is that it requires a very long turn-around-time.

FIG. 3 illustrates a prior art ion implant programming configuration 70. Those skilled in the art will recognize configuration 70 as comprising an implementation of implant programming for ROM cells. In the configuration illustrated in FIG. 3, four polysilicon layers 72, 74, 76, and 78 are shown. Implant programming offers several advantages, namely, smaller cell size and an acceptable turn-around-time. Implant programming, however, requires an extra mask, which can ultimately result in extra costs in the manufacturing process.

The present inventors have thus concluded, based on the foregoing ROM programming techniques that several key factors are desired to improve the efficiency and ultimately, the cellular and array architecture of ROM memory devices. These three desired factors include a shortened turn-around-time, a reduction in the need for utilizing an extra mask, particularly in the Via programming method, and a simple cell structure and small cell size. The invention disclosed herein addresses these needs through design and implementation

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention provide an improved architecture for a read only memory (ROM) cell.

It is another aspect of the present invention to provide methods and system for forming ROM cell-based devices.

It is yet another aspect of the present invention to provide improved methods and systems for configuring ROM cell architectures It is still another aspect of the present invention to provide an improved type of mask ROM.

It is an additional aspect of the present invention to provide improved contact via programming techniques for ROM devices, including programmable logic arrays thereof.

The above and other aspects of the present invention are achieved as is now described. A method and system are disclosed herein for forming a programmable logic array from a plurality of read only memory cells. A first or initial layer is generally established. The interconnection of the first metal layer with a second metal layer results in the formation of a read only memory cell there between, such that a plurality of read only memory cells can be configured to form a programmable logic array. One or more of the read only memory cells may be programmed utilizing a particular contact via programming technique, thereby resulting in a shortened turn-around-time, reducing read only memory cell size, and reducing the necessity of requiring additional masks for read only memory logical processes associated with the programmable logic array.

The programmable logic array can be configured to include a plurality of output lines connected to the first metal layer and a plurality of word lines connected to the second metal layer, such that a memory cells (i.e., mask ROM cell) can be formed through the interconnection of the first metal layer and the second metal layer. The programmable logic array can also be configured to comprise decoding circuitry for combining and decoding data obtained from a plurality of output lines connected to the first metal layer. Additionally, the interconnection of a subsequent metal layer with a previous metal layer can thereby form at least one read only memory cell there between, such that a plurality of read only memory cells can be configured to form the programmable logic array. Also, leakage detector circuitry may be connected to the programmable logic array to detect output current leakage.

The memory cells generally comprise mask ROM cells which do not require extra masks, and which can be programmed utilizing via programming techniques. The use of a top metal layer results in shortened turn-around-time. The utilization of a first metal layer and second metal layer interconnection configuration for a ROM cell results in smaller cell size and a simple and efficient cell structure. A simple decoding scheme is thereby utilized to decode data from the ROM cells and thus, the programmable logic array.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

The present invention generally discloses methods and systems for forming a programmable logic array from a plurality of read only memory cells. A first or initial layer is generally established. The interconnection of the first metal layer with a second metal layer results in the formation of a read only memory cell there between, such that a plurality of read only memory cells can be configured to form a programmable logic array. One or more of the read only memory cells may be programmed utilizing a particular contact via programming technique, thereby resulting in a shortened turn-around-time, reduced read only memory cell size, and a reduction in the necessity of requiring additional masks for read only memory logical processes associated with the programmable logic array.

Figure 1:
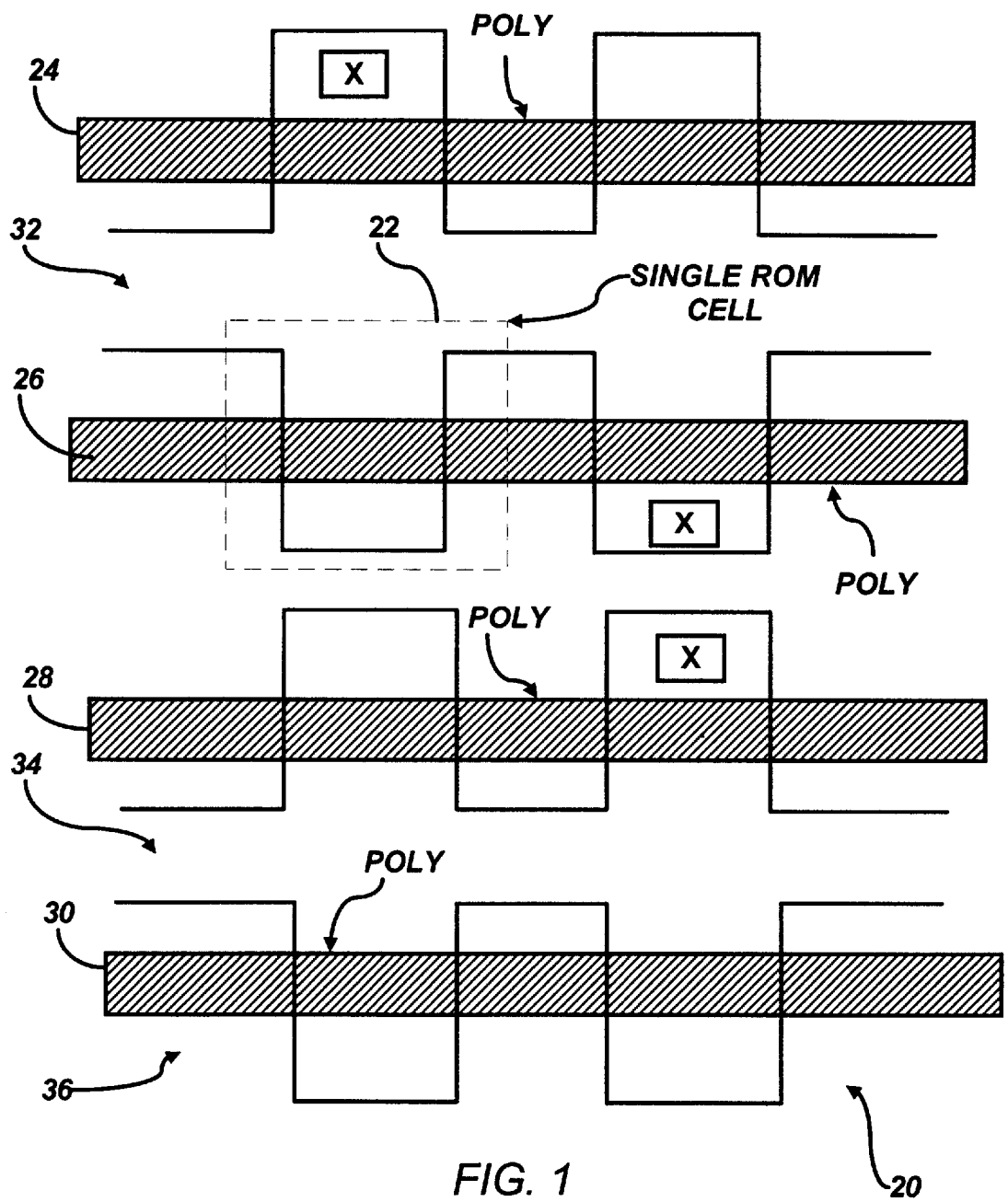
FIG. 1 illustrates a prior art mask ROM cell configuration.
Figure 2:
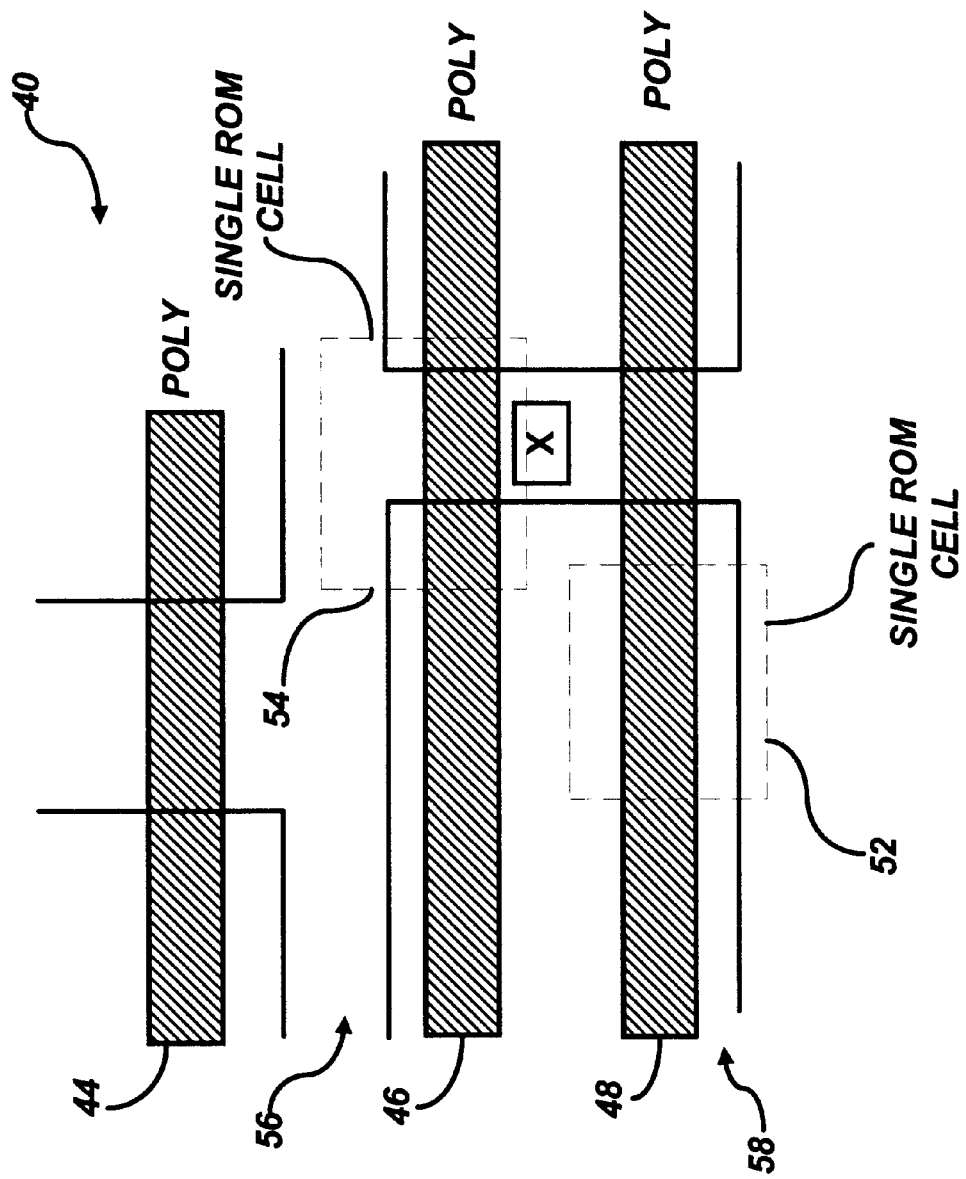
FIG. 2 depicts a prior art diffusion-programming configuration.
Figure 3:
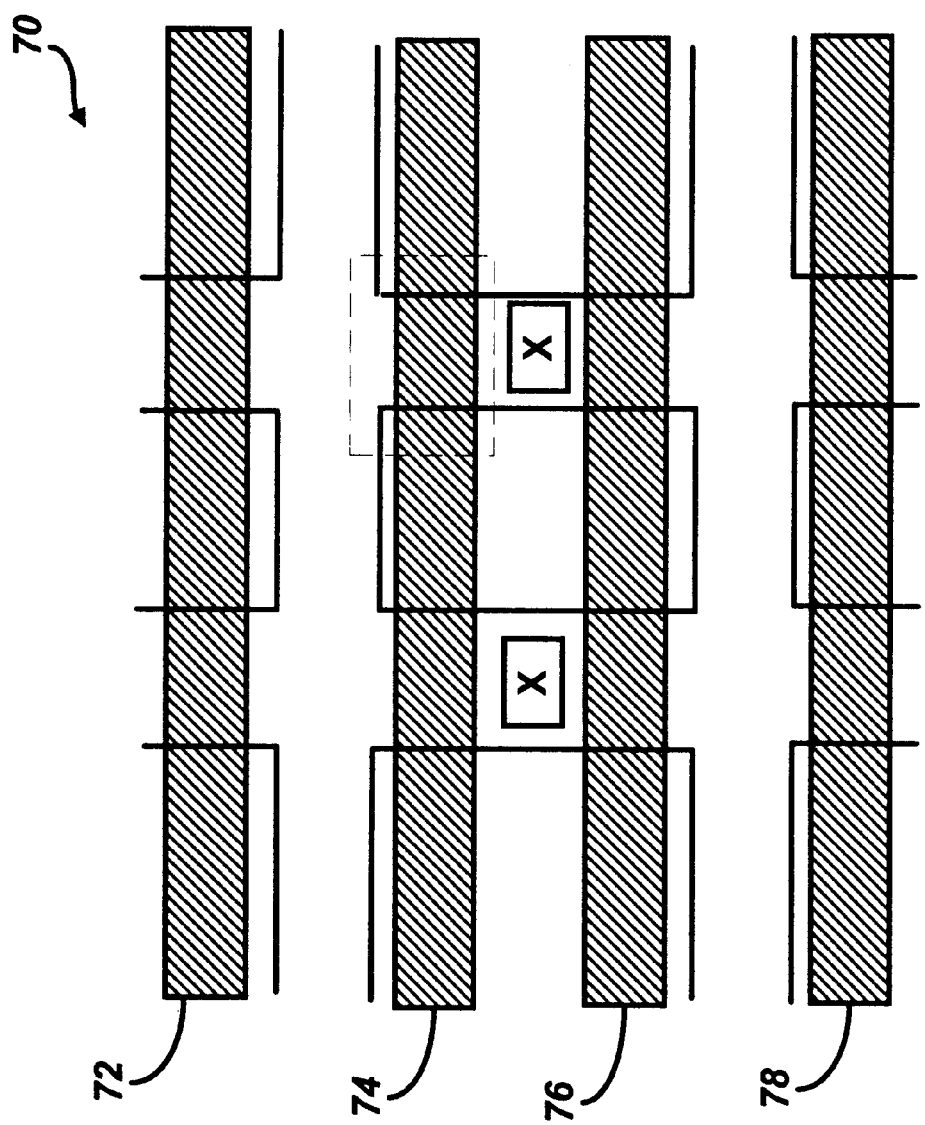
FIG. 3 illustrates a prior art implant programming configuration.
Figure 4:
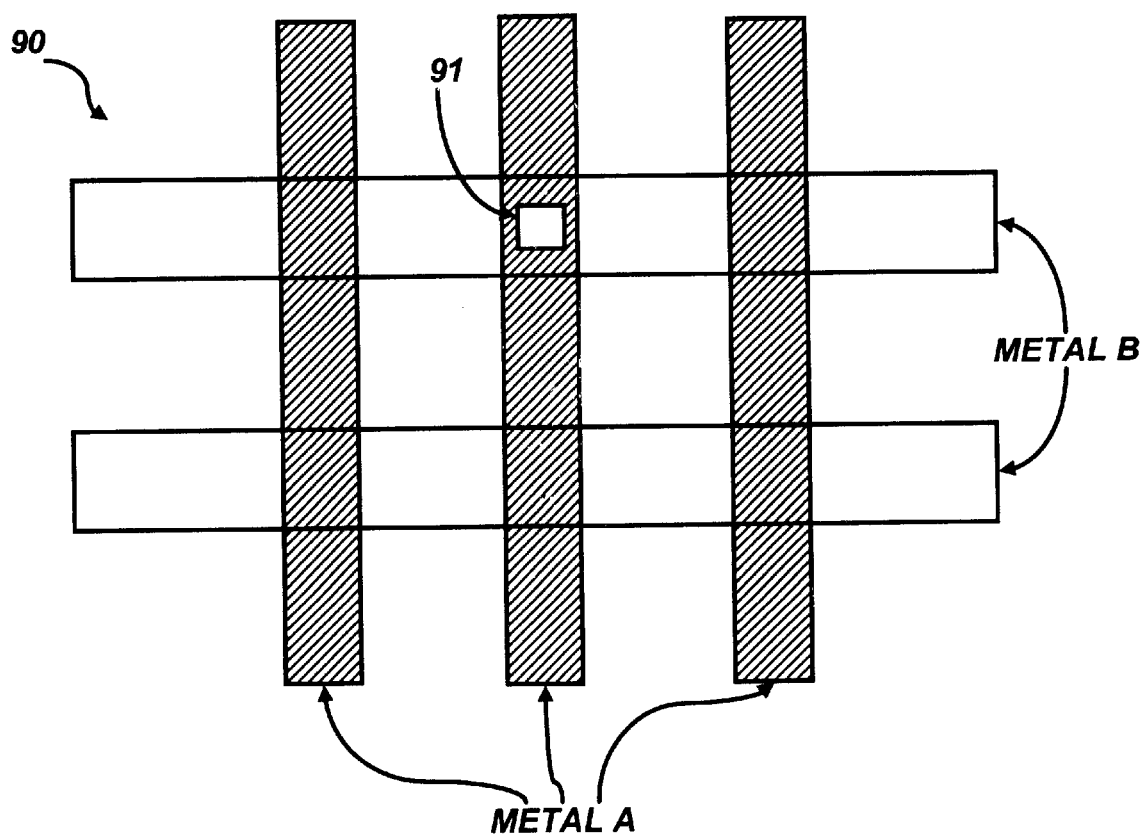
FIG. 4 depicts a basic ROM cell configuration, in accordance with a preferred embodiment of the present invention.

FIG. 4 depicts a basic ROM cell configuration 90, in accordance with a preferred embodiment of the present invention. As depicted in FIG. 4, a first metal layer, labeled "METAL A" interconnects with a second metal layer, labeled "METAL B" to form a basic ROM cell 91. Note that in the configuration 90 illustrated in FIG. 4, no real transistors exist beneath ROM cell 91. ROM cell 91 may comprise a mask ROM cell.

Figure 5:
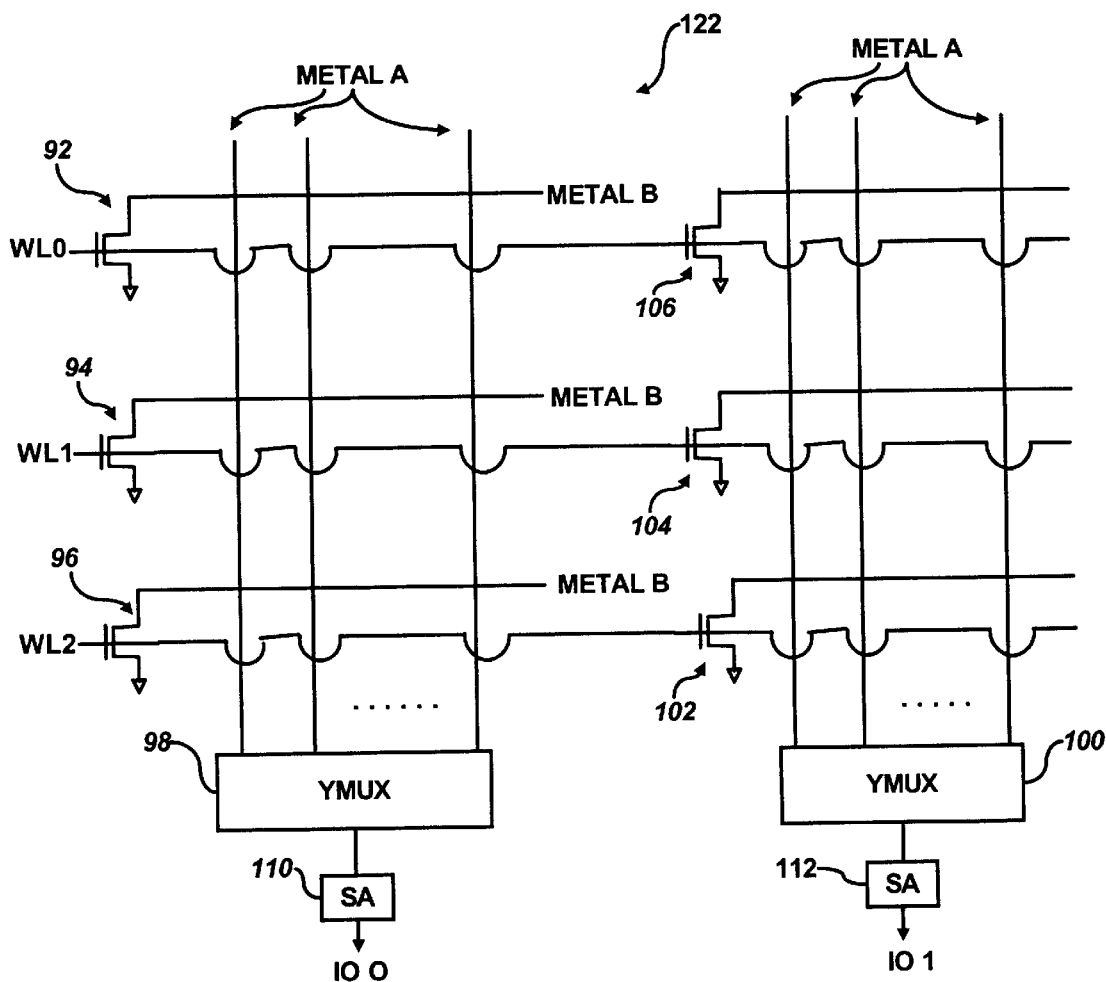
FIG. 5 illustrates an array architecture, in accordance with a preferred embodiment of the present invention.

FIG. 5 illustrates an array architecture 122, in accordance with a preferred embodiment of the present invention. Array architecture 122 can be utilized to implement a programmable logic array based on a configuration of ROM cells. Thus, as indicated in FIG. 5, transistor 92 is connected to METAL B and a word line WL0. Additionally, transistor 92 is linked to a transistor 106. A transistor 94 is connected to METAL B and a word line WL1. A transistor 96 is connected to METAL B and a word line WL2.

A plurality of METAL A lines interconnect with the METAL B lines to form a plurality of ROM cells. Output from metal lines of METAL A are combined and connected to a YMUX circuit 110, which in turn is connected to a leakage detector circuit 110 that provides input/output as IO 0. Similarly, transistor 94 is linked to a transistor 104, while transistor 96 is connected to a transistor 102. Output from METAL A lines is also combined and connected to a YMUX circuit 100, which in turn is linked to a leakage detector circuit 112 that provides input/output as IO 1. METAL A and METAL B, as illustrated in FIG. 5 is thus analogous to METAL A and METAL B depicted in FIG. 4. FIG. 4 and FIG. 5 are to be interpreted together.

Figure 6:
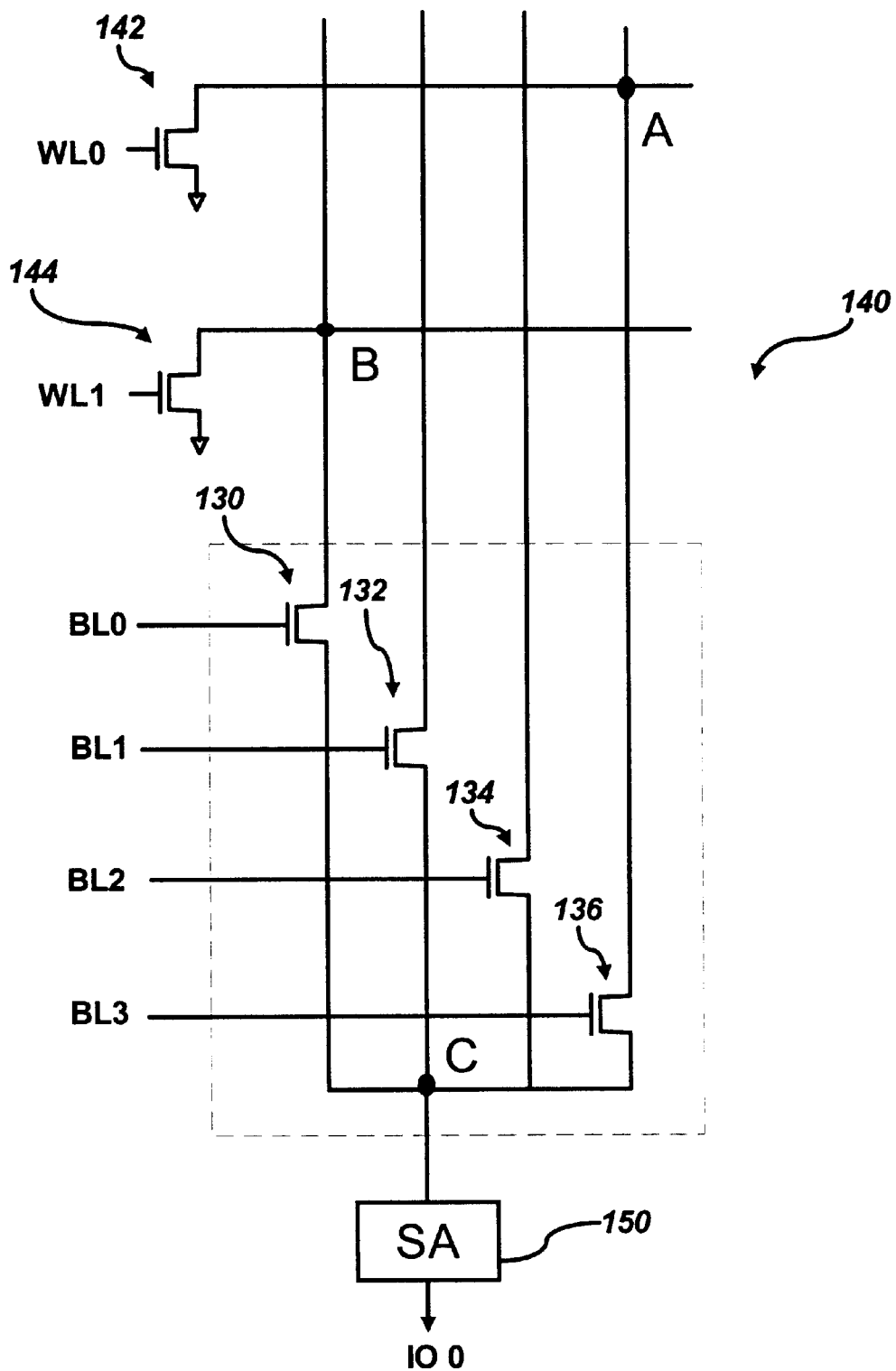
FIG. 6 depicts a ROM programming configuration, in accordance with a preferred embodiment of the present invention.

FIG. 6 depicts a ROM programming configuration 140, in accordance with a preferred embodiment of the present invention. In the configuration 140, a plurality of word lines and bit lines are illustrated. The word lines generally serve as the gate electrode of the transistors, which may be FETs. The word lines can also function as the electrical interconnection to a peripheral address decode circuit (i.e. decoder or decoding circuitry). Word line WL0 is generally connected to a transistor 142, while a word line WL1 is generally linked to a transistor 144. Transistor 142 and transistor 144 are generally linked to one another at node A.

A transistor 130 is also generally connected to transistors 142 and 144 at node A. Transistor 130 is also linked to a bit line BL0. A transistor 132 is similarly connected to node A and also a bit line BL1. A transistor 134 is generally connected to a bit line BL2, while a transistor 136 is generally linked to a bit line BL3. Leakage detector 150 is generally connected to transistors 130, 132, 134, and 136 at node C. The bit lines BL0, BL1, BL2 and BL3 can serve as the source/drain regions of the FETs (i.e. transistors 130 to 136), and also serve as the electrical interconnections to the peripheral circuits for outputting the stored binary data. Note that nodes, A, B, and C are so highlighted to indicate that via programming exists, in the example of FIG. 6.

An example of reading an "OFF" cell can be explained by reference to WL0 and BL2. Because there is no conduction path, the SA (i.e., leakage detector 150) will detect no leakage current and the output will be "zero". To read an "ON" cell, for example, by referring to WL1 and BL2, the SA can detect leakage current and the output will thus be "one". Note that WL0 and transistor 142 of FIG. 6 are analogous to WL0 and transistor 92 of FIG. 5. Likewise, WL1 and transistor 144 of FIG. 6 are analogous to WL1 and transistor 94 of FIG. 5. Additionally, leakage detector circuit 110 of FIG. 5 is analogous to leakage detector 150 of FIG. 6.

Figure 7:
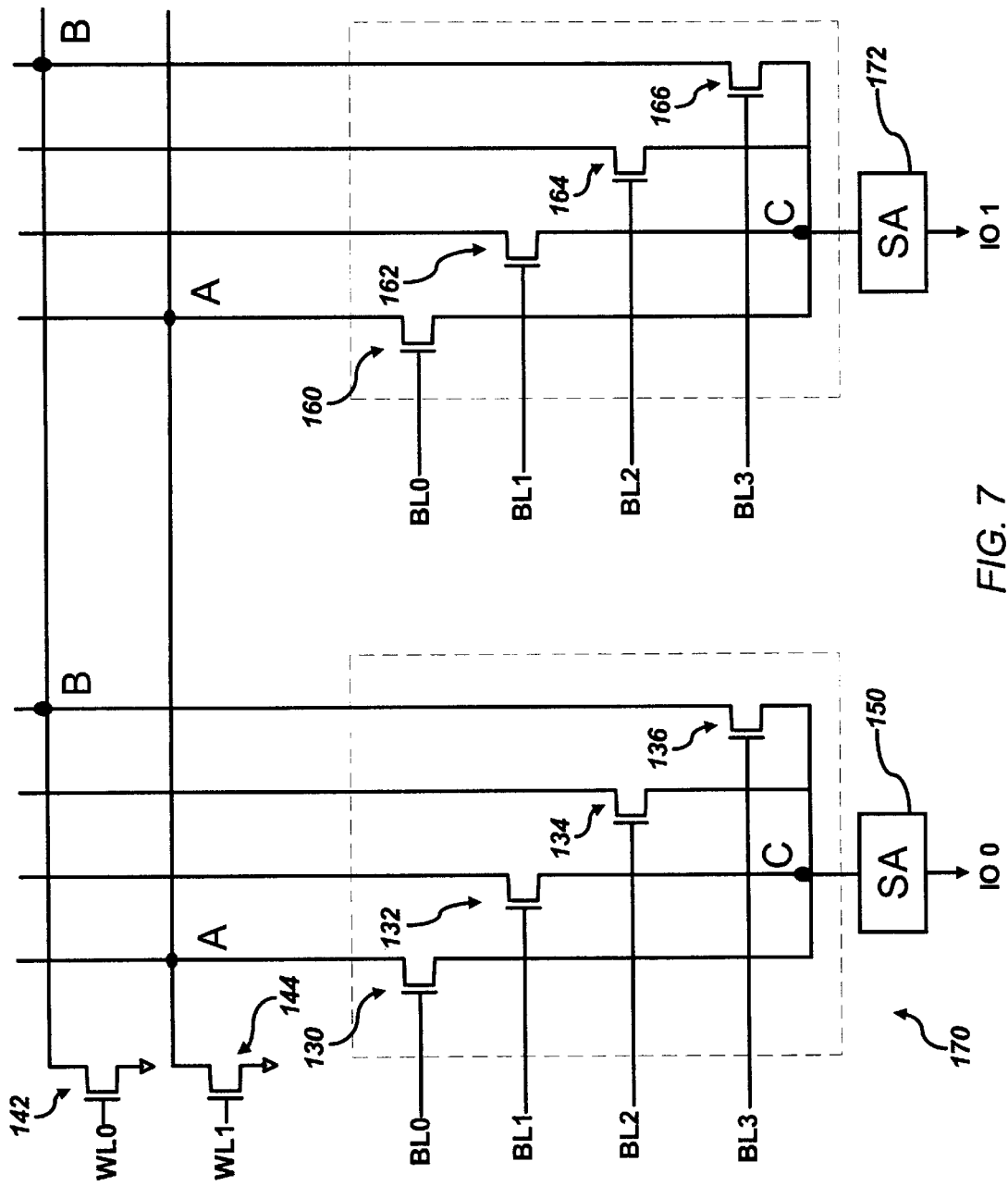
FIG. 7 illustrates an alternative ROM programming configuration, in accordance with a preferred embodiment of the present invention.

FIG. 7 illustrates an alternative ROM programming configuration 170, in accordance with a preferred embodiment of the present invention. As indicated in FIG. 7, a transistor 142 is connected to a word line WL0. A transistor 144 is generally linked to a word line 144. Transistors 142 and 144 of FIG. 7 are analogous to transistors 142 and 144 of FIG. 6. Likewise, transistors 130 to 136 of FIG. 7 are analogous to transistors 130 to 136 of FIG. 6. Note that in FIG. 6 and FIG. 7, like parts are indicated by like reference numerals. Additionally in FIG. 7, transistors 160, 162, 164, and 166 are respectively connected to word lines BL0, BL1, BL2, and BL3. A leakage detector circuit 172 is connected to transistors 160 to 166 at node C. Note that different 10's cannot share the same metal lines. Otherwise, the read operations will fail. To read an "ON" cell, for example, with reference to WL0 and BL3, IO 0 is considered "OKAY," but IO 1 may obtain incorrect data.

The ROM programming configuration illustrated in FIG. 7 thus illustrates a programmable logic array that can be configured to include a plurality of output lines, which are connected to a first metal layer and a plurality of word lines connected to a second metal layer, such that at least one ROM cell is formed through the interconnection of the first metal layer and the second metal layer. The programmable logic array can also be configured to comprise decoding circuitry for combining and decoding data obtained from a plurality of output lines connected to the first metal layer. Additionally, the interconnection of a subsequent metal layer with a previous metal layer can thereby form at least one read only memory cell there between, such that a plurality of read only memory cells can be configured to form the programmable logic array. Also, leakage detector circuitry may be connected to the programmable logic array to detect output current leakage.

The memory cells generally comprise mask ROM cells which do not require extra masks, and which can be programmed utilizing via programming techniques. The use of a top metal layer results in shortened turn-around-time. The utilization of a first metal layer and second metal layer interconnection configuration for a ROM cell results in smaller cell size and a simple and efficient cell structure. A simple decoding scheme is thereby utilized to decode data from the ROM cells and thus, the programmable logic array.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. For example, although a first metal layer and a second layer are indicated herein by way of reference to a particular embodiment, other embodiments of the present invention may be implemented to include an interconnection of third metal layers, fourth metal layers, fifth metal layers, and so forth, The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for forming a programmable logic array from a plurality of read only memory cells, said method comprising the steps of:

initially establishing a first metal layer comprising a plurality of first metal lines and a second metal layer comprising a plurality of second metal lines;

thereafter interconnecting said first metal layer with said second metal layer to thereby form a plurality of read only memory cells therebetween, wherein at least one read only memory cell of said plurality of read only memory cells is formed through the interconnection of said first metal layer and said second metal layer;

thereafter forming a programmable logic array from said plurality of read only memory cells; and thereafter programming said at least one read only memory cell of said plurality of read only memory cells of said programmable logic array utilizing contact via programming, thereby resulting in a shortened turn-around-time, reduced read only memory cell size, and a reduction in the necessity of requiring additional masks for read only memory logical processes associated with said programmable logic array.

2. The method of claim 1 further comprising the step of:

configuring said programmable logic array such that said plurality of first metal lines comprises a plurality of output lines connected to said first metal layer and said plurality of second metal lines comprises a plurality of word lines connected to said second metal layer; and configuring said programmable logic array to comprise at least one decoding circuit for combining and decoding data obtained from said plurality of output lines connected to said first metal layer.

3. The method of claim 1 further comprising the step of:

configuring said programmable logic array to comprise a decoding circuit for combining and decoding data obtained from a plurality of output lines connected to said first metal layer, wherein said plurality of output lines comprises said plurality of first metal lines.

4. The method of claim 1 further comprising the step of:

interconnecting at least one subsequent metal layer with at least one previous metal layer to thereby form at least one additional read only memory cell therebetween, such that a said plurality of read only memory cells which form said programmable logic array includes said at least one additional read only memory cell.

5. The method of claim 1 further comprising the step of:

integrating at least one leakage detector with said programmable logic array.

6. A method for forming a programmable logic array from a plurality of read only memory cells, said method comprising the steps of:

establishing a first metal layer and a second metal layer;

interconnecting said second metal layer with said first metal layer to thereby form at least one read only memory cell of a plurality of read only memory cells configured to form a programmable logic array;

configuring said programmable logic array from said plurality of read only memory cells, wherein said programmable logic array includes a plurality of output lines connected to said first metal layer and a plurality of word lines connected to said second metal layer, such that said at least one read only memory cell is formed through the interconnection of said first metal layer and said second metal layer;

connecting at least one word line of said plurality of word lines to at least one transistor;

programming said at least one read only memory cell of said plurality of cells of said programmable logic array utilizing contact via programming.

7. A method for forming a programmable logic array from a plurality of read only memory cells, said method comprising the steps of:

establishing a first metal layer and a second metal layer;

interconnecting said second metal layer with said first metal layer to form a plurality of read only memory cells therebetween, including at least one read only memory cell thereof formed through the interconnection of said first metal layer and said second metal layer;

forming a programmable logic array from said a plurality of read only memory cells;

configuring said programmable logic array to comprise a plurality of output lines connected to said first metal layer and a plurality of word lines connected to said second metal layer;

configuring said programmable logic array to comprise at least one decoding circuit for combining and decoding data obtained from a said plurality of said output lines connected to said first metal layer; and programming said at least one read only memory cell utilizing contact via programming technique.

8. A method for forming a programmable logic array from a plurality of read only memory cells, said method comprising the steps of:

establishing a first metal layer;

forming a second metal layer in association with said first metal layer;

interconnecting a said second metal layer with said first metal layer to thereby form at least one read only memory cell therebetween;

forming a plurality of read only memory cells from said at least one read only memory cell, wherein said plurality of read only memory cells comprises a structure based on an interconnection of said first metal layer with said second metal layer;

forming a programmable logic array from said plurality of read only memory cells;

configuring said programmable logic array to comprise a plurality of output lines connected to said first metal layer and a plurality of word lines connected to said second metal layer;

configuring said programmable logic array to comprise decoding circuitry for combining and decoding data obtained from a plurality of said output lines connected to said first metal layer;

interconnecting a at least one subsequent metal layer with a at least one previous metal layer to thereby form at least one additional read only memory cell therebetween; and programming said at least one read only memory cell utilizing a contact via programming, thereby resulting in a shortened turn-around-time, reduced read only memory cell size, and a reduction in the necessity of requiring additional masks for read only memory logical processes associated with said programmable logic array.

9. A method for forming a programmable logic array from a plurality of read only memory cells, said method comprising the steps of:

initially establishing a first metal layer and a second metal layer;

thereafter interconnecting a said second metal layer with said first metal layer to thereby form at least one read only memory cell therebetween, such that a plurality of read only memory cells are configured to form said programmable logic array;

thereafter configuring said programmable logic array to comprise a plurality of output lines connected to said first metal layer and a plurality of word lines connected to said second metal layer, such said at least one read only memory cell is formed through the interconnection of said first metal layer and said second metal layer;

thereafter connecting at least one leakage detector circuit to said programmable logic array; and thereafter programming said at least one read only memory cell utilizing contact via programming, thereby resulting in a shortened turn-around-time, reduced read only memory cell size, and a reduction in the necessity of requiring additional masks for read only memory logical processes associated with said programmable logic array.

10. A method for configuring a read only memory cell, said method comprising the steps of:

establishing a first metal layer and a second metal layer;

interconnecting a said second metal layer with said first metal layer to thereby form a at least one only memory cell therebetween, such that a plurality of said at least one read only memory cells are configured to form a programmable logic array; and programming said read only memory cell utilizing contact via programming, thereby resulting in a shortened turn-around-time, reduced read only memory cell size, and a reduction in the necessity of requiring additional masks for read only memory logical processes associated with said programmable logic array.

11. A programmable logic array system formed from a plurality of read only memory cells, said system comprising:

a first metal layer;

a second metal layer interconnected with said first metal layer to form a plurality of read only memory cells therebetween, including at least one read only memory cell thereof;

a programmable logic array configured from said plurality of read only memory cells; and contact via programming mechanism for programming said at least one read only memory cell of said plurality of read only memory cells, which form said programmable logic array, thereby resulting in a shortened turn-around-time, reduced read only memory cell size, and a reduction in the necessity of requiring additional masks for read only memory logical processes associated with said programmable logic array.

12. The system of claim 11 wherein said programmable logic array comprises a plurality of output lines connected to said first metal layer and a plurality of word lines connected to said second metal layer, such said at least one read only memory cell of said plurality of read only memory cells is formed through the interconnection of said first metal layer and said second metal layer.

13. The system of claim 11 wherein said programmable logic array comprises decoding circuitry for combining and decoding data obtained from a plurality of output lines connected to said first metal layer.

14. The system of claim 11 further comprising:

at least one subsequent metal layer interconnected with at least one previous metal layer; and at least one additional read only memory cell formed between said at least one subsequent metal layer and said at least one previous metal layer wherein said programmable logic array includes said at least one additional read only memory cell.

15. The system of claim 11 wherein said programmable logic array is integrated with at least one leakage detector circuit.

16. A programmable logic array system, comprising:

a first metal layer interconnected with a second metal layer to thereby form at least one read only memory cell there between, such that a plurality of read only memory cells are configured to form a programmable logic arrays, comprising a plurality of output lines connected to said first metal layer and a plurality of word lines connected to said second metal layer, wherein at least one read only memory cell of said plurality of read only memory cells is formed through the interconnection of said first metal layer and said second metal layer; and said at least one read only memory cell programmed utilizing a particular contact via programming technique, thereby resulting in a shortened turn-around-time, reduced read only memory cell size, and a reduction in the necessity of requiring additional masks for read only memory logical processes associated with said programmable logic array.

17. A programmable logic array system, comprising:

a first metal layer interconnected with a second metal layer;

a plurality of read only memory cells formed between said first metal layer and said second metal layer;

a programmable logic array comprising said plurality of read only memory cells formed between said first metal layer and said second metal layer;

a plurality of output lines connected to said first metal layer and a plurality of word lines connected to said second metal layer;

at least one decoding circuit for combining and decoding data obtained from a said plurality of said output lines connected to said first metal layer, wherein said at least one decoding circuit is integrated with said programmable logic array; and at least one read only memory cell of said plurality of read only memory cells programmed utilizing a particular contact via programming technique.

18. A programmable logic array system, comprising:

a first metal layer interconnected with a second metal layer to thereby form at least one read only memory cell therebetween a programmable logic array formed from a plurality of read only memory cells, including said at least one read only memory cell;

a plurality of output lines connected to said first metal layer and a plurality of word lines connected to said second metal layer;

at least one decoding circuit for combining and decoding data obtained from a plurality of said output lines connected to said first metal layer, wherein said at least one decoding circuit is integrated with said programmable logic array;

at least one a subsequent metal layer interconnected with at least one a previous metal layer to said plurality of read only memory cells of said programmable logic array; and at least one read only memory cell of said plurality of read only memory cells programmed utilizing contact via programming, thereby resulting in a shortened turn-around-time, reduced read only memory cell size, and a reduction in the necessity of requiring additional masks for read only memory logical processes associated with said programmable logic array.

19. A programmable logic array system, comprising:

a first metal layer interconnected with a second metal layer to thereby form at least one read only memory cell therebetween;

a programmable logic array formed from a plurality of read only memory cells, including said at least one read only memory cell formed by the interconnection of said first metal layer with said second metal layer;

a plurality of output lines connected to said first metal layer and a plurality of word lines connected to said second metal layer;

leakage detector circuitry connected to said programmable logic array; and contact via programming mechanism for programming said at least one read only memory cell of said plurality of read only memory cells of said programmable logic array, thereby resulting in a shortened turn-around-time, reduced read only memory cell size, and a reduction in the necessity of requiring additional masks for read only memory logical processes associated with said programmable logic array.

20. A system for configuring a read only memory cell, said system comprising:

a first metal layer interconnected with a second metal layer to thereby form a plurality of read only memory cells therebetween, including at least one read only memory cell of said plurality of read only memory cells;

a programmable logic array configured from said plurality of read only memory cells formed between said first metal layer and said second metal layer; and contact via programming mechanism for programming said at least one read only memory cell.

* * * * *